United States Patent
Suzuki et al.

(10) Patent No.: US 10,026,616 B2
(45) Date of Patent: Jul. 17, 2018

(54) METHOD OF REDUCING STRESS IN METAL FILM AND METAL FILM FORMING METHOD

(71) Applicant: TOKYO ELECTRON LIMITED, Tokyo (JP)

(72) Inventors: Kenji Suzuki, Tokyo (JP); Takanobu Hotta, Nirasaki (JP); Koji Maekawa, Nirasaki (JP); Yasushi Aiba, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/165,524

(22) Filed: May 26, 2016

(65) Prior Publication Data

US 2016/0351402 A1     Dec. 1, 2016

(30) Foreign Application Priority Data

May 28, 2015 (JP) ................. 2015-108432

(51) Int. Cl.
| | |
|---|---|
| *H01L 21/768* | (2006.01) |
| *H01L 21/285* | (2006.01) |
| *C23C 16/455* | (2006.01) |
| *C23C 16/02* | (2006.01) |
| *C23C 16/14* | (2006.01) |
| *H01L 21/321* | (2006.01) |
| *H01L 21/3205* | (2006.01) |

(52) U.S. Cl.
CPC .... *H01L 21/28556* (2013.01); *C23C 16/0281* (2013.01); *C23C 16/14* (2013.01); *C23C 16/45525* (2013.01); *H01L 21/28562* (2013.01); *H01L 21/321* (2013.01); *H01L 21/32051* (2013.01); *H01L 21/76868* (2013.01); *H01L 21/76876* (2013.01); *H01L 21/76877* (2013.01)

(58) Field of Classification Search
CPC .................................. H01L 21/76838
See application file for complete search history.

(56) References Cited

U.S. PATENT DOCUMENTS

| | | | | | |
|---|---|---|---|---|---|
| 5,407,698 A | * | 4/1995 | Emesh | ................ | C23C 16/02 257/E21.585 |
| 2016/0351401 A1 | * | 12/2016 | Ba | ................ | H01L 21/28556 |

FOREIGN PATENT DOCUMENTS

| | | |
|---|---|---|
| JP | 2003-193233 A | 7/2003 |
| JP | 2004-273764 A | 9/2004 |
| JP | 2006-28572 A | 2/2006 |
| KR | 10-2008-0101745 A | 11/2008 |

OTHER PUBLICATIONS

Ammerlaan, et al., "Chemical vapour deposition of tungsten by H2 reduction of WCI6", Applied Surface Science, vol. 53, pp. 24-29, 1991.

* cited by examiner

*Primary Examiner* — Peniel M Gumedzoe
*Assistant Examiner* — Christopher Johnson
(74) *Attorney, Agent, or Firm* — Nath, Goldberg & Meyer; Jerald L. Meyer

(57) ABSTRACT

There is provided a method of reducing stress in a metal film that is highly stressed, the method including: processing the metal film by supplying a metal chloride gas containing a metal of the metal film and a reduction gas for reducing the metal chloride gas onto the metal film; and forming a process film on the metal film to reduce stress in the metal film.

21 Claims, 11 Drawing Sheets

METHOD OF REDUCING STRESS IN METAL FILM AND METAL FILM FORMING METHOD

CROSS-REFERENCE TO RELATED APPLICATION

This application claims the benefit of Japanese Patent Application No. 2015-108432, filed on May 28, 2015, in the Japan Patent Office, the disclosure of which is incorporated herein in its entirety by reference.

TECHNICAL FIELD

The present disclosure relates to a method of reducing stress in a metal film and a method of forming the metal film.

BACKGROUND

In manufacturing a large-scale integration (LSI), tungsten has been widely used for MOSFET gate electrodes, source-drain contacts, memory wordlines and the like. A Cu wiring has been mainly used in a multilayer wiring process. However, Cu has a poor heat resistance and is easily diffused. As such, tungsten has been used for a portion that requires a heat resistance or a portion of which an electric property may deteriorate due to the diffusion of Cu.

A physical vapor film formation (PVD) method has been used as a film forming process of a tungsten film. However, it is difficult to use such a PVD method for portion that requires a high coverage rate (step coverage). Because of this, a chemical vapor film formation (CVD) method which provides good step coverage has been performed to form the tungsten film.

As a method of forming a tungsten film (CVD-tungsten film) using such a CVD method, a method of inducing a reaction of $WF_6+3H_2 \rightarrow W+6HF$ on a semiconductor wafer as a target substrate, by using a tungsten hexafluoride ($WF_6$) as a raw material gas and an $H_2$ gas as a reduction gas, is generally used.

On the other hand, when the tungsten film is formed by the CVD method using the $WF_6$ gas, fluorine contained in $WF_6$ reduces a gate insulation film in a semiconductor device, particularly in gate electrodes, memory wordlines or the like, which deteriorates an electric property of the semiconductor device. A method of forming a CVD-tungsten film containing no fluorine is under consideration as a way to address such a problem.

As a raw material gas used in forming the CVD-tungsten film containing no fluorine, tungsten hexachloride ($WCl_6$) is known. Although chlorine has a reduction property like fluorine, reactivity of chlorine is weaker than that of fluorine. As such, chlorine is expected to hardly affect the electric property.

In recent years, as the semiconductor device becomes finer and finer, it is difficult to use the CVD method, which is known to provide good step coverage, to bury a film into a complex-shaped pattern. Thus, from the viewpoint of obtaining higher step coverage, an atomic layer film formation (ALD) method which sequentially supplies a raw material gas and a reduction gas while performing a purge process in the course of sequentially supplying the raw material gas and the reduction gas, is getting a lot of attention.

In some instances, when a metal film such as a tungsten film is formed by the CVD method or the ALD method, the metal film thus formed tends to be highly-stressed. Such a metal film causes a semiconductor wafer to be bent, which is detrimental in that a desired masking is not achieved in a subsequent process, in manufacturing the semiconductor wafer. For such reason, there is a need for a technology for allowing a metal film such as a tungsten film used in a semiconductor device to be stressed as little as possible.

SUMMARY

Some embodiments of the present disclosure provide a method of reducing stress in a metal film and a method of forming the metal film.

According to one embodiment of the present disclosure, there is provided a method of reducing stress in a metal film that is highly stressed, the method including: processing the metal film by supplying a metal chloride gas containing a metal of the metal film and a reduction gas for reducing the metal chloride gas onto the metal film; and forming a process film on the metal film to reduce stress in the metal film.

According to another embodiment of the present disclosure, there is provided a method of forming a metal film, including: forming a metal film on a target substrate; processing the metal film by supplying a metal chloride gas containing a metal of the metal film and a reduction gas for reducing the metal chloride gas; and forming a process film on the metal film to reduce stress in the metal film.

According to yet another embodiment of the present disclosure, there is provided a method of forming a metal film, including: forming a first tungsten film as the metal film by sequentially supplying a tungsten chloride gas and a reduction gas for reducing the tungsten chloride gas onto a target substrate; and forming a second tungsten film as a process film on the first tungsten film by sequentially or simultaneously supplying the tungsten chloride gas and the reduction gas for reducing the tungsten chloride gas onto the target substrate with the first tungsten film formed thereon so as to reduce stress in the first tungsten film, wherein a flow rate of the tungsten chloride gas in the forming a first tungsten film is lower than that of the tungsten chloride gas in the forming the second tungsten film.

According to still yet another embodiment of the present disclosure, there is provided a method of forming a metal film, including: forming a first tungsten film as the metal film by supplying a $WF_6$ gas and a reduction gas for reducing the $WF_6$ gas onto a target substrate; and forming a second tungsten film by sequentially or simultaneously supplying a tungsten chloride gas and a reduction gas for reducing the tungsten chloride gas onto the target substrate with the first tungsten film formed thereon.

According to still yet another embodiment of the present disclosure, there is provided non-transitory storage medium storing a program that operates on a computer and controls a film forming apparatus, wherein the program, when executed, causes the computer to control the film forming apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, various embodiments of the present disclosure will be specifically described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Principle of Stress Reduction>

A principle of stress reduction will be now described.

Figure 1A:
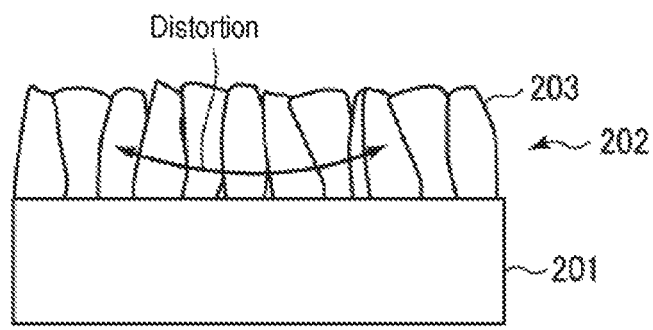
FIGS. 1A to 1C are views schematically illustrating a principle of decreasing stress in a metal film according to the present disclosure.
Figure 1B:
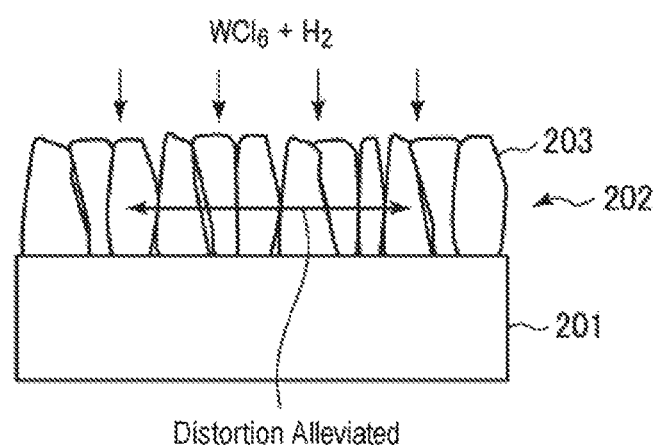
Figure 1C:
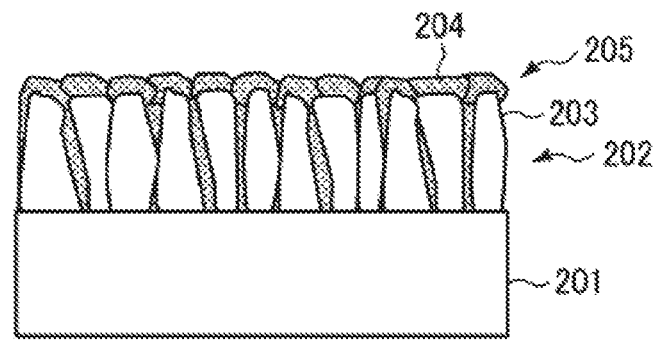

FIGS. 1A to 1C are views schematically illustrating a principle of stress reduction in a metal film according to the present disclosure.

For example, when a tungsten film 202 is formed on a base film 201 such as an $SiO_2$ film or a TiN film using an ALD method which sequentially supplies a film-forming raw material gas and a reduction gas or a CVD method which simultaneously supplies the film-forming raw material gas and the reduction gas, a high distortion is sometimes generated between crystal grains 203 as shown in FIG. 1A. Such a high distortion allows a formed tungsten film 202 to be highly-stressed. Such great stress means enough stress to cause a problem such as bending of a semiconductor wafer. In general, stress of approximately 1,000 MPa (1 GPa) or more may be defined as a great stress.

As shown in FIG. 1B, a process of supplying a $WCl_6$ gas as a raw material gas and an $H_2$ gas as a reduction gas to the highly-stressed tungsten film 202 is performed. At this time, when the raw material gas and the reduction gas are sequentially supplied, a reaction according to the following Formula (1) is induced to produce HCl:

  (1)

Since HCl produced by this reaction has a strong etching property, it etches the tungsten film 202 by a reaction according to the following Formula (2):

  (2)

Further, such an etching action etches grain boundaries of the crystal grains 203 of the highly-stressed tungsten film 202, which alleviates a distortion between the crystal grains 203.

At this time, as shown in FIG. 1C, by the sequential supply process, a process film 204 is formed in gaps defined between the crystal grains 203, which are generated by the etching action, and on a surface of the tungsten film 202. As a result, a tungsten film 205 including the process film 204, which is entirely lowly stressed, is obtained.

As described above, through the etching action by a tungsten chloride gas such as $WCl_6$, it is possible to reduce stress in a highly-stressed film.

<Stress Reduction Process>

The stress reduction process described above is to form a film using the ALD method which sequentially supplies the tungsten chloride gas and the reduction gas or the CVD method which simultaneously supplies the tungsten chloride gas and the reduction gas. Among these method, the ALD method which forms the film as one layer may be preferably used. The ALD-based film formation is effective to alleviate surface/film energy, which noticeably enhances the effect of the stress reduction. The CVD method may be utilized for the process film having a thin thickness.

An example of the tungsten chloride may include $WCl_5$ and $WCl_4$ in addition to $WCl_6$. Among them, $WCl_6$ may be preferably used in some applications.

Further, the reduction gas is not limited to the $H_2$ gas but may be other reduction gases which contain hydrogen. Instead of the $H_2$ gas, an $SiH_4$ gas, a $B_2H_6$ gas, an $NH_3$ gas or the like may be used as the reduction gas. Alternatively, two or more of the $H_2$ gas, the $SiH_4$ gas, the $B_2H_6$ gas and the $NH_3$ gas may be supplied. Moreover, in addition to these gases, other reduction gases such as a $PH_3$ gas or an $SiH_2Cl_6$ gas may be used. From the viewpoint of further decreasing impurities in the film to obtain a low resistance value, the $H_2$ gas may be used.

Even if the combination of the tungsten chloride gas and the reduction gas is applied, if the tungsten film is not effectively etched, it is difficult to obtain a stress reduction effect. That is to say, the stress reduction process needs to be performed under a condition that the highly-stressed tungsten film can be effectively etched. On the contrary, a tungsten film formed by the ALD method or the CVD method using the tungsten chloride gas and the reduction gas under a condition that there is no stress reduction effect, may likely become a highly-stressed tungsten film.

An etching property in the stress reduction process depends on a flow rate of supplied tungsten chloride gas.

Since an appropriate range of the flow rate of the tungsten chloride gas varies depending on, e.g., the size of a chamber, a partial pressure of the tungsten chloride gas inside the chamber may be used as an indicator of the flow rate of the tungsten chloride gas. When a $WCl_6$ gas is used as the tungsten chloride gas, a partial pressure of the $WCl_6$ gas may fall within a range of approximately 0.5 to 10 Torr (66.7 to 1,333 Pa) from the viewpoint of obtaining an effective etching action and inhibiting an over-etching.

In some embodiments, a temperature of the wafer in the stress reduction process may be 300 degrees C. or more. Further, in some embodiments, the inside of the chamber may fall within a range of 20 to 100 Torr (2,666 to 13,330 Pa).

A thickness of the process film which is formed by the stress reduction process may be appropriately set depending on a stress value or film thickness of the highly-stressed tungsten film. Even if the thickness of the process film is thin, the stress reduction effect may be obtained. In order to obtain an effective stress reduction effect, the film thickness of the process film may fall within a range of approximately 0.5 to 20 nm. By adjusting the film thickness of the process film which is formed by the stress reduction process, it is possible to control stress in the tungsten film.

<Example of Processing Apparatus Used in Stress Reduction Process>

Figure 2:
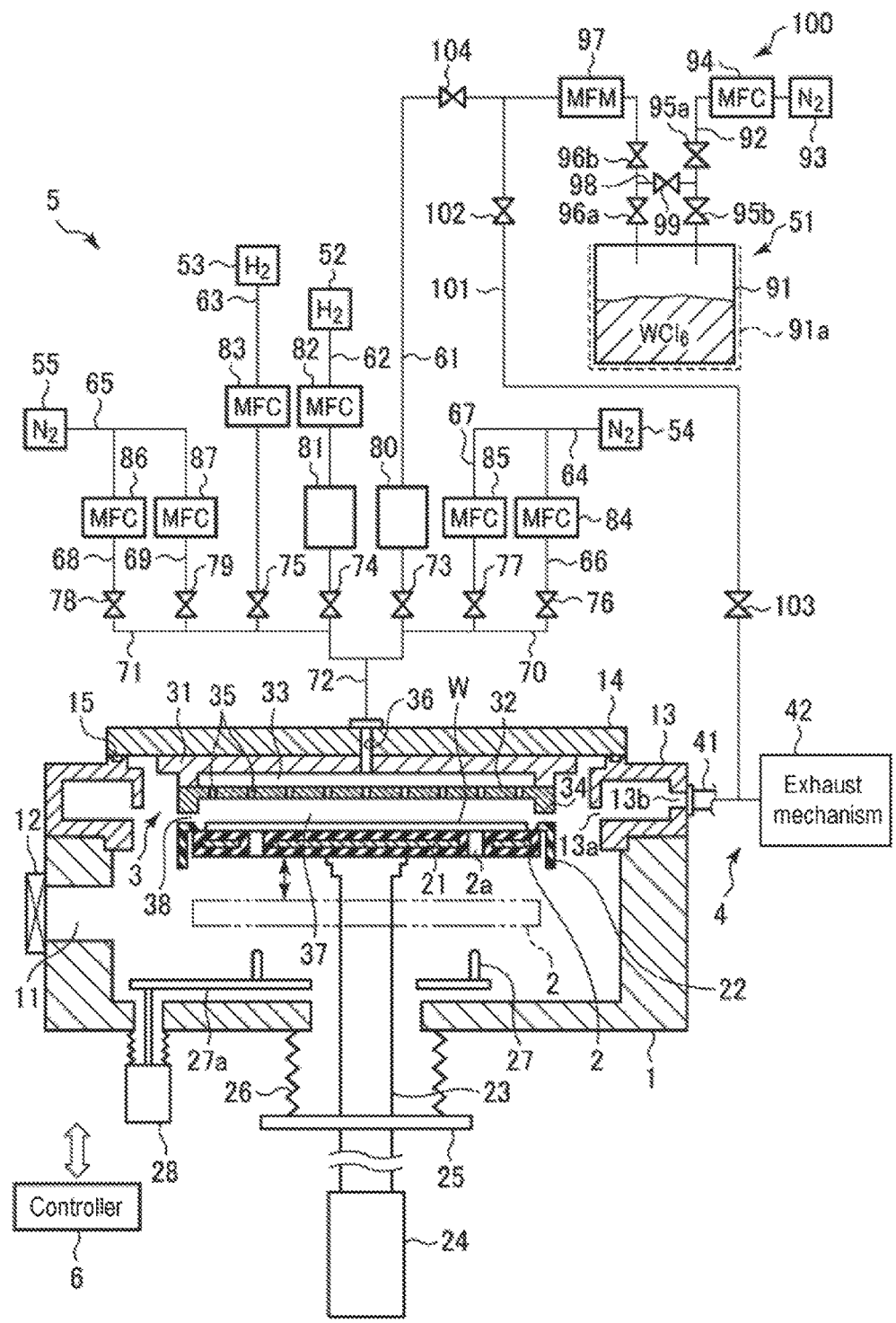
FIG. 2 is a sectional view showing an example of a processing apparatus which is used for a stress reduction process.

FIG. 2 is a sectional view showing an example of a processing apparatus which is used in the stress reduction process. This processing apparatus is configured as a film forming apparatus which is capable of performing both the ALD-based and the CVD-based film formation modes.

A processing apparatus 100 includes a chamber 1, a susceptor 2 configured to horizontally support a semiconductor wafer (hereinafter, simply referred to as a "wafer") W as a target substrate inside the chamber 1, a shower head 3 configured to supply a process gas into the chamber 1 in the form of a shower, an exhaust part 4 configured to exhaust an interior of the chamber 1, a process gas supply mechanism 5 configured to supply the process gas into the shower head 3, and a controller 6.

The chamber 1 is made of a metal such as Al and has a substantially cylindrical shape. A loading/unloading port 11 through which the wafer W is loaded into and unloaded from the chamber 1 is formed in a sidewall of the chamber 1. The loading/unloading port 11 is opened and closed by a gate valve 12. An annular exhaust duct 13 having a rectangular cross-section is installed on a main body of the chamber 1. The exhaust duct 13 has a slit 13a formed along an inner peripheral surface of the exhaust duct 13. Further, the exhaust duct 13 has an exhaust port 13b formed in an outer wall of the exhaust duct 13, A ceiling wall 14 is installed on a top face of the exhaust duct 13 so as to block an upper opening of the chamber 1. A sealing ring 15 is air-tightly installed between the ceiling wall 14 and the exhaust duct 13.

The susceptor 2 has a disk shape which corresponds to a size of the wafer W, and is supported by a support member 23. The susceptor 2 is made of a ceramic material such as an aluminum nitride (AlN) or a metallic material such as an aluminum- or nickel-based alloy. A heater 21 for heating the wafer W is embedded in the susceptor 2. The heater 21 is configured to generate heat based on power supplied from a heater power supply (not shown). An output of the heater 21 is controlled according to a temperature signal obtained at a thermocouple (not shown) such that the wafer W is controlled to a predetermined temperature. The thermocouple is installed near a wafer mounting surface (where the wafer W is mounted) in an upper surface of the susceptor 2.

The susceptor 2 is provided with a cover member 22 made of ceramics such as alumina to cover an outer peripheral area of the wafer mounting surface and a lateral side of the susceptor 2.

The support member 23 configured to support the susceptor 2 is configured to extend from the center of a lower surface of the susceptor 2 toward a position below the chamber 1 through a hole formed in a bottom wall of the chamber 1. A lower end of the support member 23 is connected to an elevating mechanism 24. With an operation of the elevating mechanism 24, the susceptor 2 is configured to vertically move between a process position a current position of the susceptor 2 shown in FIG. 2) and a transfer position (indicated by a dashed double-dotted line in FIG. 2) where the wafer W can be transferred, by the support member 23. Further, a flange part 25 through which the support member 23 penetrates is installed at a position below the chamber 1. A bellows 26 is installed between a bottom surface of the chamber 1 and the flange 25. The bellows 26 is configured to isolate an internal atmosphere of the chamber 1 from ambient air and to be flexible with the vertical movement of the susceptor 2.

Three wafer support pins 27 (only two of them are shown in FIG. 2) are installed to protrude upward from an elevating plate 27a in the vicinity of the bottom surface of the chamber 1. The wafer support pins 27 are configured to be lifted and lowered by the elevating plate 27a with an operation of an elevating mechanism 28 installed below the chamber 1. Further, the wafer support pins 27 are configured to penetrate through-holes 2a formed in the susceptor 2 placed at the transfer position so that they come in and out of the upper surface of the susceptor 2. By lifting and lowering the wafer support pins 27 in this way, the wafer W is transferred between a wafer transfer mechanism (not shown) and the susceptor 2.

The shower head 3 made of a metal is installed to face the susceptor 2, and has a diameter substantially identical to that of the susceptor 2. The shower head 3 includes a main body 31 fixed to the ceiling wall 14 of the chamber 1, and a shower plate 32 connected to a lower portion of the main body 31. A gas diffusion space 33 is defined between the main body 31 and the shower plate 32. The gas diffusion space 33 is connected to a gas inlet hole 36 which is formed to penetrate both central portions of the main body 31 and the ceiling wall 14 of the chamber 1. The shower plate 32A has an annular protrusion 34 which is formed to protrude downward from a peripheral portion of the shower plate 32. Gas discharge holes 35 are formed in an inner flat surface of the shower plate 32 other than the annular protrusion 34.

When the susceptor 2 is placed at the process position, a process space 37 is defined between the shower plate 32 and the susceptor 2, and the annular protrusion 34 and an upper surface of the cover member 22 of the susceptor 2 approach each other to form an annular gap 38.

The exhaust part 4 includes an exhaust pipe 41 connected to the exhaust port 13b of the exhaust duct 13, and an exhaust mechanism 42 connected to the exhaust pipe 41. The exhaust mechanism 42 is provided with a vacuum pump, a pressure control valve or the like. When the wafer is processed, a gas inside the chamber 1 flows to the exhaust duct 13 through the slit 13a, and subsequently, is exhausted from the exhaust duct 13 through the exhaust pipe 41 by the exhaust mechanism 42 of the exhaust part 4.

The process gas supply mechanism 5 includes a $WCl_6$ gas supply mechanism 51 for supplying a $WCl_6$ gas used as a tungsten chloride gas that is a tungsten raw material gas, a first $H_2$ gas supply source 52 for supplying an $H_2$ gas as a main reduction gas, a second $H_2$ gas supply source 53 for supplying an $H_2$ gas as an additive reduction gas, and a first gas supply source 54 and a second $N_2$ gas supply source 55 for supplying an $N_2$ gas as a purge gas. Further, the process gas supply mechanism 5 includes a $WCl_6$ gas supply line 61 installed to extend from the $WCl_6$ gas supply source 51, a first $H_2$ gas supply line 62 installed to extend from the first $H_2$ gas supply source 52, a second $H_2$ gas supply line 63 installed to extend from the second $N_2$ gas supply source 53, a first $N_2$ gas supply line 64 which is installed to extend from the first $N_2$ gas supply source 54 and through which the $N_2$ gas is supplied to the $WCl_6$ gas supply line 61, and a second $N_2$ supply line 65 which is installed to extend from the second $N_2$ gas supply source 55 and through which the gas is supplied to the first $H_2$ gas supply line 62.

The first $N_2$ gas supply line 64 is branched into a first continuous $N_2$ gas supply line 66 through which the $N_2$ gas is always supplied during the ALD method-based film forming process, and a first flash purge line 67 through which the $N_2$ gas is supplied only during a purge process. Similarly, the second $N_2$ gas supply line 65 is branched into a second continuous $N_2$ gas supply line 68 through which the $N_2$ gas is always supplied during the ALD method-based film forming process, and a second flash purge line 69 through which the $N_2$ gas is supplied only during the purge process. The first continuous $N_2$ gas supply line 66 and the first flash purge line 67 are connected to a first connection line 70 which is connected to the $WCl_6$ gas supply line 61. Further, the second $H_2$ gas supply line 63, the second continuous $N_2$ gas supply line 68 and the second flash purge line 69 are connected to a second connection line 71 which is connected to the first $H_2$ gas supply line 62. The $WCl_6$ gas supply line 61 and the first $H_2$ gas supply line 62 are joined in a joint pipe 72. The joint pipe 72 is connected to the aforementioned gas inlet hole 36.

At most downstream sides of the $WCl_6$ gas supply line 61, the first $H_2$ gas supply line 62, the second $H_2$ gas supply line 63, the first continuous $N_2$ gas supply line 66, the first flash purge line 67, the second continuous $N_2$ gas supply line 68 and the second flash purge line 69, on-off valves 73, 74, 75, 76, 77, 78 and 79 for switching the supply of respective gases during the ALD process are respectively installed. Further, mass flow controllers (MFC) 82, 83, 84, 85, 86 and 87 as flow rate controllers are installed at upstream sides of the on-off valves 74, 75, 76, 77, 78 and 123 of the first $H_2$ gas supply line 62, the second $H_2$ gas supply line 63, the first continuous $N_2$ gas supply line 66, the first flash purge line 67, the second continuous $N_2$ gas supply line 68 and the second flash purge line 69, respectively. Furthermore, buffer tanks 80 and 81 are respectively installed in the $WCl_6$ gas supply line 61 and the first $H_2$ gas supply line 62 such that required gases can be supplied in a short period of time.

The $WCl_6$ gas supply mechanism 51 includes a film-forming raw material tank 91 which stores $WCl_6$ therein. $WCl_6$ is solid at room temperature. Such a solid $WCl_6$ is stored in the film-forming raw material tank 91. A heater 91a is installed around the film-forming raw material tank 91 so that the film-forming raw material within the film-forming raw material tank 91 is heated to a suitable temperature, thus sublimating the $WCl_6$ material The $WCl_6$ gas supply line 61 is inserted into the film-forming raw material tank 91 from above.

Further, the $WCl_6$ gas supply mechanism 51 includes: a carrier gas pipe 92 inserted into the film-forming raw material tank 91 from above; a carrier $N_2$ gas supply source 93 for supplying an $N_2$ gas as a carrier gas to the carrier gas pipe 92; a mass flow controller (MFC) 94 as a flow rate controller and on-off valves 95a and 95b positioned at a downstream side of the mass flow controller 94, which are connected to the carrier gas pipe 92; and on-off valves 96a and 96b and a flowmeter (MFM) 97, which are installed in the $WCl_6$ gas supply line 61 in the vicinity of the film-forming raw material tank 91. In the carrier gas pipe 92, the on-off valve 95a is installed directly below the mass flow controller 94, whereas the on-off valve 95b is installed at a side where the carrier gas pipe 92 is inserted into the film-forming raw material tank 91. The on-off valves 96a and 96b and the flowmeter 97 are sequentially arranged in the $WCl_6$ gas supply line 61 starting from a side where the $WCl_6$ gas supply line 61 is inserted into the film-forming raw material tank 91.

A bypass pipe 98 is installed to connect a portion between the on-off valve 95a and the on-off valve 95b in the carrier gas pipe 92 to a portion between the on-off valve 96a and the on-off valve 96b in the $WCl_6$ gas supply line 61. The bypass pipe 98 includes an on-off valve 99 installed therein. By closing the on-off valves 95b and 96a and opening the on-off valves 99, 95a and 96b, the $N_2$ gas supplied from the carrier $N_2$ gas supply source 93 is introduced to the $WCl_6$ gas supply line 61 through a series of the carrier gas pipe 92 and the bypass pipe 98 so that the $WCl_6$ gas supply line 61 can be purged.

One end of an EVAC pipe 101 is connected to a downstream position of the flowmeter 97 in the $WCl_6$ gas supply line 61 and the other end thereof is connected to the exhaust pipe 41. On-off valves 102 and 103 are installed in the vicinity of the $WCl_6$ gas supply line 61 and the exhaust pipe 41 in the EVAC pipe 101, respectively. Further, an on-off valve 104 is installed at a downstream side of a connection position where the EVAC pipe 101 is connected to the $WCl_6$ gas supply line 61. The on-off valves 104, 99, 95a and 95b are closed and the on-off valves 102, 103, 96a and 96b are opened to vacuum-exhaust the interior of the film-forming raw material tank 91 by the exhaust mechanism 42.

The controller 6 includes: a process controller equipped with a microprocessor (computer) for controlling respective components of the processing apparatus 100, i.e., the valves, the power supplies, the heaters, the pumps and the like; a user interface; and a storage part. The respective components of the processing apparatus 100 are configured to be electrically connected to the process controller such that they are controlled by the process controller. The user interface is connected to the process controller, and includes a keyboard that enables an operator to input commands for managing the respective components of the processing apparatus 100, a display that visually displays operational states of the respective components of the processing apparatus 100, and the like. The storage part is also connected to the process controller and stores a control program for implementing various processes which are performed in the processing apparatus 100 under the control of the process controller; a control program (i.e., a process recipe) for executing predetermined processes in the respective components of the processing apparatus 100 depending on process conditions; various databases; or the like. The processing recipe is stored in a storage medium (not shown) of the storage part. The storage medium may be a fixedly-installed medium such as a hard disk, or a portable medium such as a CDROM, a DVD and a semiconductor memory. Further, the process recipe may be appropriately transmitted from another device through, e.g., a dedicated line. If necessary, a predetermined process recipe may be called from the storage part according to an instruction from the user interface and then executed by the process controller so that a desired process is performed in the processing apparatus 100 under the control of the process controller.

In the processing apparatus 100 configured as above, the stress reduction process is performed as follows. First, in a state where the susceptor 2 is lowered to be positioned at the transfer position, the gate valve 12 is opened such that the wafer W having a highly-stressed tungsten film formed thereon is loaded into the chamber 1 through the loading/unloading port 11 by a transfer device (not shown). Subsequently, the wafer W is mounted on the susceptor 2 which has been heated to a predetermined temperature by the heater 21. The susceptor 2 is lifted up to the process position. The interior of the chamber 1 is vacuum-exhausted to a predetermined degree of vacuum. The on-off valves 104, 95a, 95b and 99 are closed and the on-off valves 102, 103, 96a and 96b are opened so that the interior of the film-forming raw material tank 91 is vacuum-exhausted through the EVAC pipe 101. Thereafter, the on-off valves 76 and 78 are opened and the on-off valves 73, 74, 75, 77 and 79 are closed such that the $N_2$ gases supplied from the first $N_2$ gas supply source 54 and the second $N_2$ gas supply source 55 are respectively introduced into the chamber 1 through the first continuous $N_2$ gas supply line 66 and the second continuous $N_2$ gas supply line 68, thereby increasing the internal pressure of the chamber 1 and stabilizing the temperature of the wafer W mounted on the susceptor 2.

After the internal pressure of the chamber reaches a predetermined pressure, the on-off valves 102 and 103 are closed and the on-off valves 104, 95a and 95b are opened such that the internal pressure of the film-forming raw material tank 91 is increased, thus establishing a condition in which the $WCl_6$ gas as the tungsten raw material can be supplied.

In this state, the $WCl_6$ gas as the film-forming raw material gas, the $H_2$ gas as the reduction gas, and the $N_2$ gas as the purge gas are supplied in a sequential manner as described below such that the stress reduction process is continuously performed.

Figure 3:
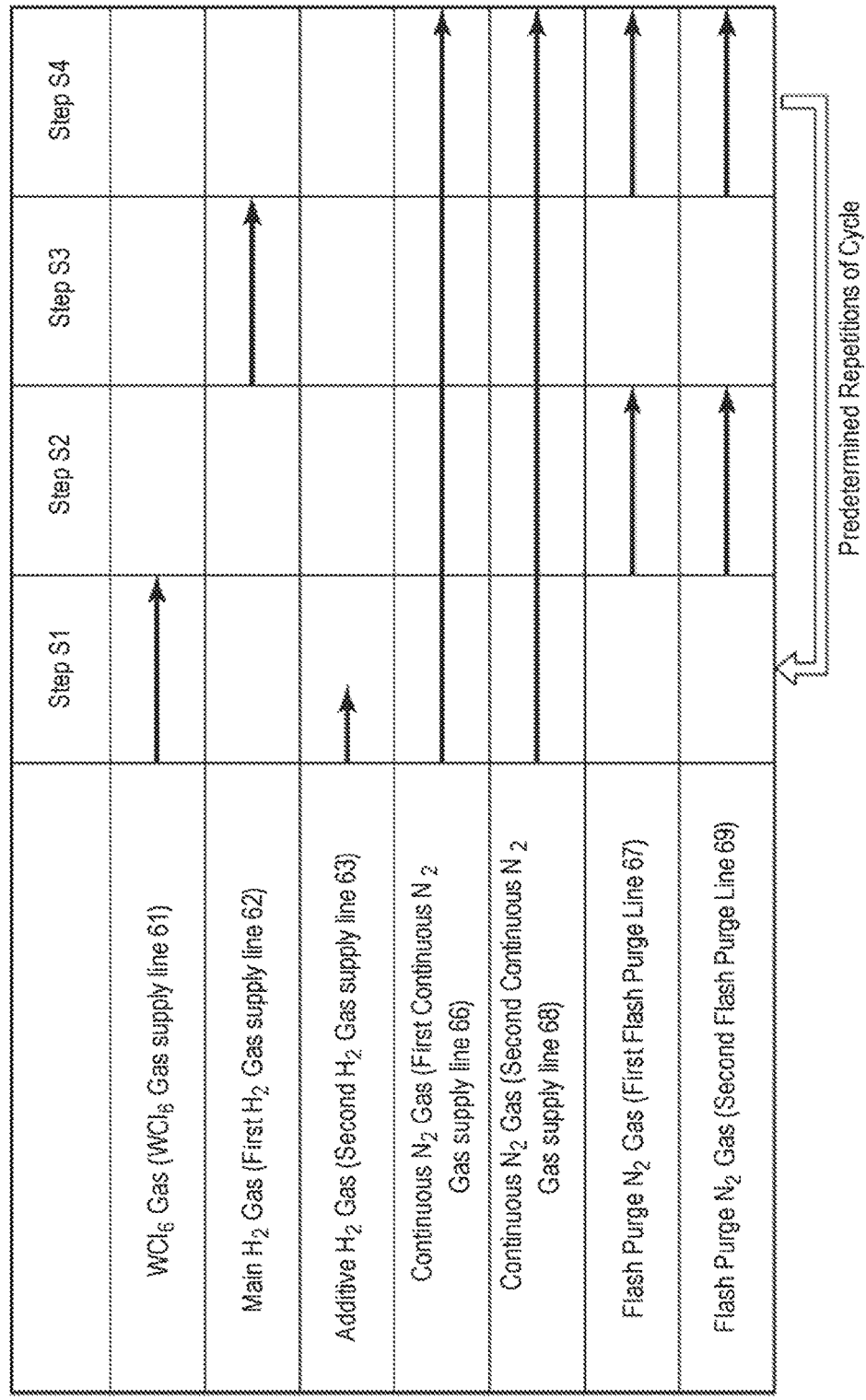
FIG. 3 is a view showing an example of a gas supply sequence when forming a process film.

FIG. 3 is a view showing an example of a gas supply sequence when performing the stress reduction process.

First, the on-off valves 76 and 78 are opened and the $N_2$ gases are continuously supplied from the first $N_2$ gas supply source 54 and the second $N_2$ gas supply source 55 through the first continuous $N_2$ gas supply line 66 and the second continuous $N_2$ gas supply line 68. Further, the on-off valves 73 and 75 are opened and the $WCl_6$ gas is supplied from the $WCl_6$ gas supply mechanism 51 through the $WCl_6$ gas supply line 61 into the process space 37 in the chamber 1. The $H_2$ gas (i.e., the additive $H_2$ gas) as the additive reduction gas is supplied into the chamber 1 through the second $H_2$ gas supply line 63 extending from the second $H_2$ gas supply source 53 (in Step S1). At this time, the $WCl_6$ gas is first stored in the buffer tank 80 and then supplied into the chamber 1.

In Step S1, $WCl_6$ is adsorbed onto a surface of the wafer W. At $WCl_6$ is activated by the $H_2$ gas which is simultaneously supplied into the chamber 1.

Subsequently, while the $N_2$ gas is continuously supplied through the first continuous $N_2$ gas supply line 66 and the second continuous $N_2$ gas supply line 68, the on-off valves 73 and 75 are closed to stop the supply of the $WCl_6$ gas and the $H_2$ gas, and simultaneously, the on-off valves 77 and 79 are opened to supply the $N_2$ gas (i.e., a flash purge $N_2$ gas) through the first flash purge line 67 and the second flash purge line 69. Thus, a high flow rate of the $N_2$ gas purges an extra $WCl_6$ gas and the like existing in the process space 37 (in Step S2).

Subsequently, the on-off valves 77 and 79 are closed to stop the supply of the $N_2$ gas through the first flash purge line 67 and the second flash purge line 69, while the $N_2$ gas is continuously supplied through the first continuous $N_2$, gas supply line 66 and the second continuous $N_2$ gas supply line 68. At this state, the on-off valve 74 is opened to supply the $H_2$ gas (i.e., the main $H_2$ gas) as the main reduction gas from the first $H_2$ gas supply source 52 into the process space 37 through the first $H_2$ gas supply line 62 (in Step S3). At this time, the $H_2$ gas is first stored in the buffer tank 81 and then supplied into the chamber 1.

In Step S3, $WCl_6$ adsorbed onto the water W is reduced. At this time, a flow rate of the main $H_2$ gas corresponds to a sufficient level to induce the reduction reaction and is lower than that of the additive $H_2$ gas in Step S1.

Subsequently, while the $N_2$ gas is continuously supplied through the first continuous $N_2$ gas supply line 66 and the second continuous $N_2$ gas supply line 68, the on-off valve 74 is closed to stop the supply of the $H_2$ gas through the first $H_2$ gas supply line 62, and the on-off valves 77 and 79 are opened to stop the supply of the $N_2$ gas (i.e., the flash purge $N_2$ gas) through the first flash purge line 67 and the second flash purge line 69. Thus, like in Step S2, a high flow rate of the $N_2$ gas purges the extra $H_2$ gas existing in the process space 37 (in Step S4).

A single cycle including Steps S1 to S4 described above is performed in a short period of time to form a unit tungsten film having a thin thickness. Further, the single cycle including Steps 1 to 4 is repeated a multiple number of times to form a process film having a desired film thickness. The film thicknesses of the process film at this time can be controlled according to the number of repetitions of the single cycle.

Figure 4:
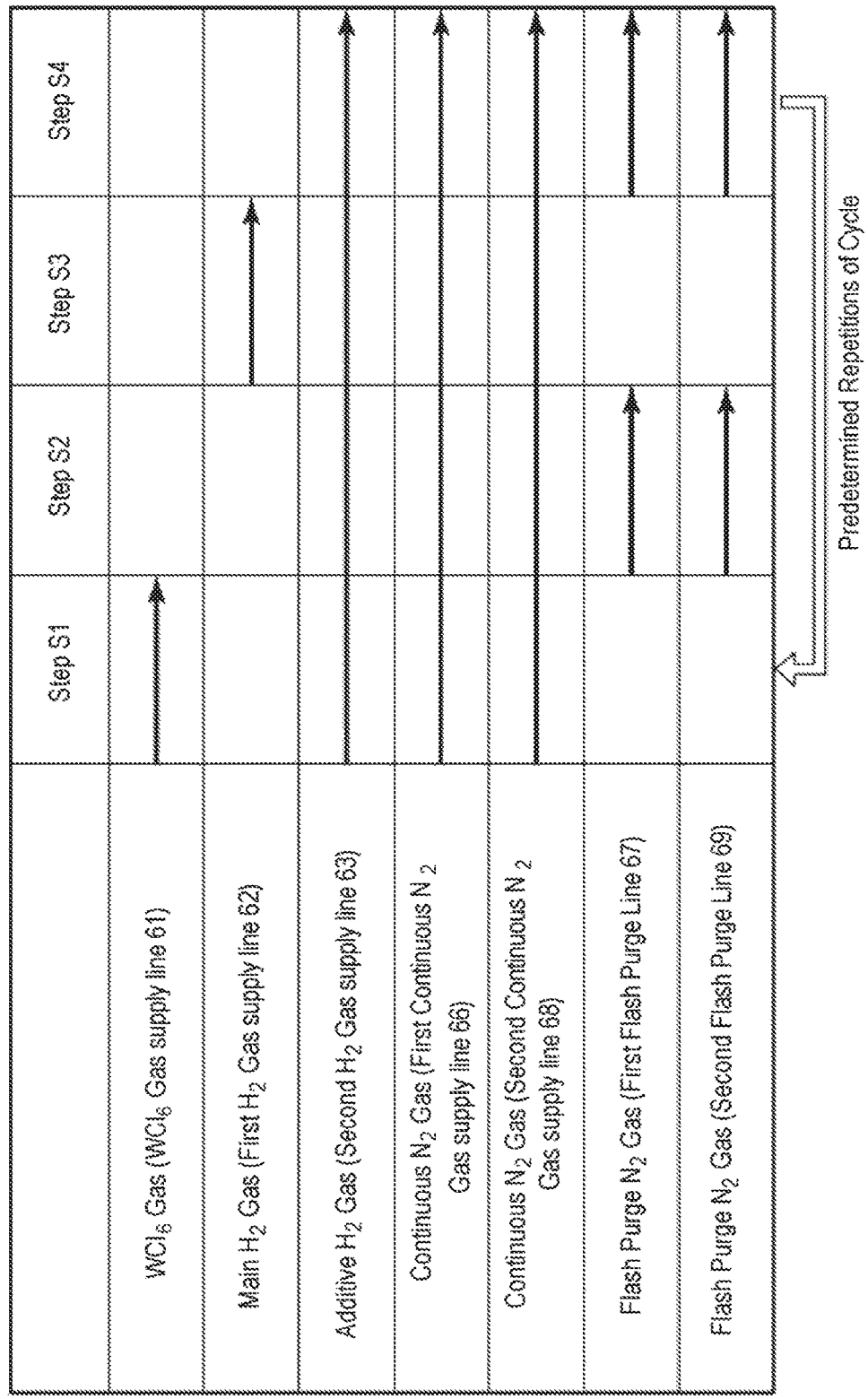
FIG. 4 is a view showing another example of the gas supply sequence when forming the process film.

In Step S1, in parallel with the supply of the $WCl_6$ gas, the additive reduction gas is also supplied through the second $H_2$ gas supply line 63 to activate the $WCl_6$ gas. This facilitates a film formation reaction in the subsequent Step S3. It is therefore possible to keep the step coverage at a high level and increase a thickness of the film formed per cycle, thus increasing a film forming rate. The flow rate of the $H_2$ gas at this time needs to be controlled to suppress the CVD-based reaction while ensuring the ALD-based reaction. Thus, the flow rate of the $H_2$ gas may range from 100 to 500 sccm (mL/min). In some embodiments, as shown in FIG. 4, the additive $H_2$ gas may be always supplied through the second $H_2$ gas supply line 63 during the period of Steps S2 to S4. With this configuration, when the $WCl_6$ gas is supplied, the additive $H_2$ gas as the additive reduction gas is also supplied, thus activating the $WCl_6$ gas. The flow rate of the $H_2$ gas at this time may range from 10 to 500 sccm (mL/min) from the viewpoint of suppressing the CVD-based reaction and keeping the ALD-based reaction. However, if a good film formation reaction is induced even in the absence of the additive $H_2$ gas, the additive $H_2$ gas may be omitted.

In the above sequence, the $N_2$ gas as the purge gas always flows from the first continuous $N_2$ gas supply line 66 and the second continuous $N_2$ gas supply line 68 to the $WCl_6$ gas supply line 61 and the first $H_2$ gas supply line 62 during the period of Steps S1 to S4, while the $WCl_6$ gas and the $H_2$ gas are intermittently supplied in Steps S1 and S3. It is therefore possible to improve a replacement efficiency of gas inside the process space 37. Further, the $N_2$ gas is supplied through each of the first flash purge line 67 and the second flash purge line 69 to purge the process space 37 in Steps S2 and S4. This further improves the replacement efficiency of gas inside the process space 37. It is therefore possible to control the thickness of the tungsten film at a good level.

In the processing apparatus 100 shown in FIG. 2, the buffer tanks 80 and 81 are installed in the $WCl_6$ gas supply line 61 and the first $H_2$ gas supply line 62, respectively. This facilitates the supply of the $WCl_6$ gas and the $H_2$ gas in a short period of time. Thus, even if a period of the single cycle is short, it is possible to easily supply the $WCl_6$ gas and the gas at a flow rate required for Steps S1 and S3.

In some embodiments, when the stress reduction process is performed by the CVD method, the $WCl_6$ gas and $H_2$ gas are simultaneously supplied through the $WCl_6$ gas supply line 61 and the first $H_2$ gas supply line 62, respectively.

<Process Conditions>

The following is an example of process conditions of the stress reduction process.

i) ALD
Pressure: 5 to 50 Torr (666.5 to 6,665 Pa)
Temperature: 300 degrees C. or more some embodiments, 450 to 600 degrees C.)
Flow Rate of $WCl_6$ Gas: 3 to 60 sccm (mL/min)
(Flow Rate of Carrier Gas: 100 to 2,000 sccm (mL/min))
Partial Pressure of $WCl_6$ Gas: 0.5 to 10 Torr (66.7 Pa to 1,333 Pa)
Flow Rate of Main $H_2$ Gas: 2,000 to 8,000 sccm (mL/min)
Flow Rate of Additive $H_2$ Gas: 100 to 500 sccm (mL/min)
Flow Rate of Continuously-Supplied $N_2$ Gas: 100 to 500 sccm (mL/min)
(through the first and second continuous $N_2$ gas supply lines 66 and 68)
Flow Rate of Flash Purge $N_2$ Gas: 500 to 3000 sccm (mL/min)
(through the first and second flash purge lines 67 and 69)
Period of Time of Step S1 (Per cycle): 0.01 to 5 sec
Period of Time of Step S3 (Per cycle): 0.1 to 5 sec
Period of Times of Steps S2 and S4 (Purging) (Per cycle): 0.1 to 5 sec
Period of Supply Time of Additive $H_2$ Gas in Step S1 (Per cycle): 0.01 to 0.3 sec
Heated Temperature of Film-forming Raw Material Tank: 130 to 190 degrees C.

ii) CVD
Pressure: 5 to 50 Torr (666.5 to 6,665 Pa)
Temperature: 300 degrees C. or more (In some embodiments, 450 to 600 degrees C.)
Flow Rate of $WCl_6$ Gas: 3 to 60 sccm (mL/min)
(Flow Rate of Carrier Gas: 100 to 2,000 sccm (mL/min))
Partial Pressure of $WCl_6$ Gas: 0.5 to 10 Torr (66.7 Pa to 1,333 Pa)
Flow Rate of Main $H_2$ Gas: 2,000 to 8,000 sccm (mL/min)
Flow Rate of $N_2$ Gas: 100 to 500 sccm (mL/min)

<First Embodiment of Film Forming Method>

Next, a first embodiment of a method of forming a tungsten film will be described.

This example is an example in which a tungsten film is formed using the $WCl_6$ gas and the $H_2$ gas and subsequently, the stress reduction process is performed.

Figure 5:
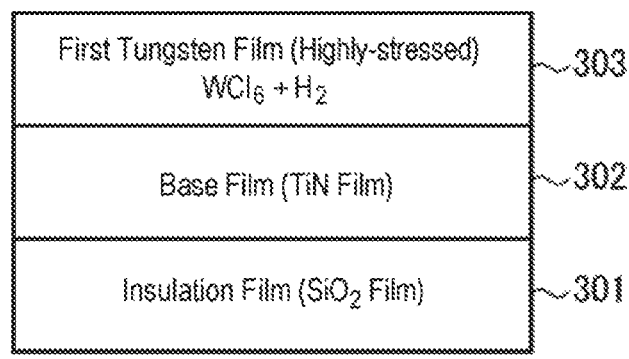
FIG. 5 is a cross-sectional view showing a state where a first tungsten film is formed, in a first embodiment of a film forming method.

In the first embodiment, for example, as shown in FIG. 5, a first tungsten film 303 is formed on a wafer W having an insulation film 301 (such as an $SiO_2$ film) followed by a base film 302 by the ALD method using the $WCl_6$ gas and the $H_2$ gas. Although in FIG. 5 the insulation film 301 and the base film 302 has been shown in a planar shape for the sake of simplicity, fine complex-shaped concave portions are formed in the insulation film 301 in practice, and the base film 302 is formed on the insulation film 301 along such concave portions.

An example of the base film 302 may include a titanium-based material film such as a TiN film, a TiSiN film, a Ti silicide film, a Ti film, a TiON film, a TiAlN film or the like. In some embodiments, an example of the base film 302 may include a tungsten-based compound film such as a WN film, a $WSi_x$ film, a WSiN film or the like. The formation of the base film 302 on the insulation film 301 allows the tungsten film to be formed with good adhesion.

Figure 6:
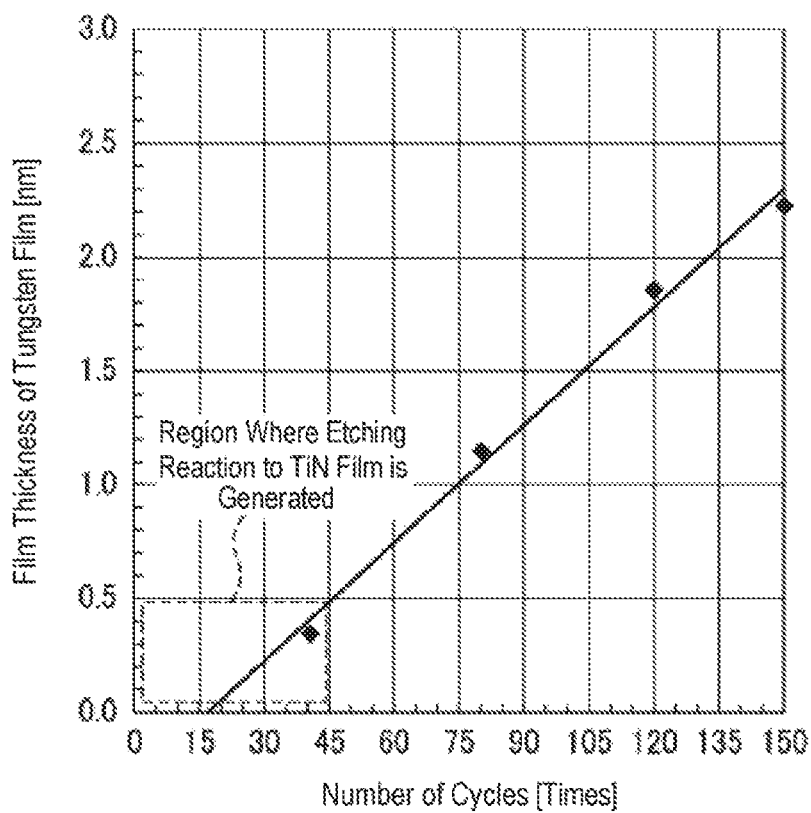
FIG. 6 is a view showing a relationship between the number of cycles and a film thickness when the first tungsten film is formed, in the first embodiment of the film forming method.
Figure 7:
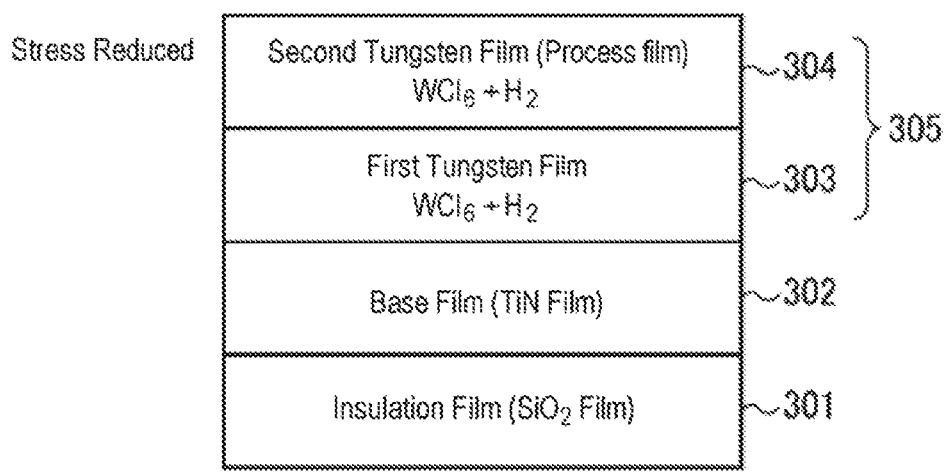
FIG. 7 is across-sectional view showing a state where a second tungsten film is formed on the first tungsten film, in the first embodiment of the film forming method.

When the TiN film is used as the base film 302, the $WCl_6$ gas as the tungsten chloride gas and the $H_2$ gas as the reduction gas are sequentially supplied into the chamber 1 while purging the interior of the chamber 1 in the course of sequentially supplying the gases, such that the first tungsten film 303 is formed on the base film 302 by the ALD method. In this case, as shown in FIG. 6, in a region where the first tungsten film 303 is hardly deposited or a deposition amount thereof is small, the $WCl_6$ gas is directly supplied to the TiN film so that an etching reaction between the TiN film and the $WCl_6$ gas occurs as follows:

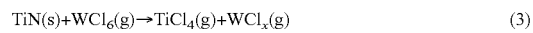

$$TiN(s)+WCl_6(g) \rightarrow TiCl_4(g)+WCl_x(g) \qquad (3)$$

Similarly, even when other titanium-based material films and tungsten-based compound films are used as the base film 302, the base film 302 is etched by the $WCl_6$ gas as the tungsten chloride gas.

In order to suppress the etching of the base film 302, the $WCl_6$ gas is supplied at a relatively low flow rate such that the first tungsten film 303 is formed. As described above, since the first tungsten film 303 is formed by the $WCl_6$ gas of the relatively low flow rate, a small amount of HCl gas is generated, thus suppressing the first tungsten film 303 from being etched by the generated HCl gas. This causes distortion between tungsten crystal grains so that the first tungsten film 303 is highly-stressed.

At this time, the first tungsten film 303 can be formed using a film forming apparatus having the same structure as that of the processing apparatus 100 of FIG. 2. A film formation process performed at this time is the ALD method.

An example of film formation conditions of the highly-stressed first tungsten film 303 is as follows:

Pressure: 20 to 100 Torr (2,666 to 13,330 Pa)
Temperature: 300 degrees C. or more (in some embodiments, 450 to 600 degrees C.)
Flow Rate of $WCl_6$ Gas: 0.1 to 10 sccm (mL/min)
(Flow Rate of Carrier Gas: 1 to 1,000 sccm (mL/min))
Partial Pressure of $WCl_6$ Gas (previously described): 1 Torr (133.3 Pa) or less (in some embodiments, 0.1 Torr (13.33 Pa) or less)
Flow Rate of Main $H_2$ Gas: 10 to 5,000 sccm (mL/min)
Flow Rate of Continuously-Supplied $N_2$ Gas: 10 to 10,000 sccm (mL/min)
(through the first and second continuous $N_2$ gas supply lines 66 and 68)
Flow Rate of Flash Purge $N_2$ Gas: 100 to 100,000 sccm (mL/min)
(through the first and second flash purge lines 67 and 69)
Period of Time of Step S1 (Per Cycle): 0.01 to 5 sec
Period of Time of Step S3 (Per Cycle): 0.1 to 5 sec
Period of Time of each of Steps S2 and S4 (Purging) (Per Cycle): 0.1 to 5 sec
Period of Supply Time of Additive $H_2$ Gas in Step S1 (Per Cycle): 0.01 to 0.3 sec
Heated Temperature of Film-forming Raw Material Tank: 130 to 190 degrees C.

An example of the tungsten chloride used when forming the first tungsten film 303 may include $WCl_5$ and $WCl_4$ in addition to the aforementioned $WCl_6$. Among these materials, $WCl_6$ may be preferably used.

Further, the reduction gas is not limited to the $H_2$ gas but may be other reduction gases which contain hydrogen. Instead of the $H_2$ gas, an $SiH_4$ gas, a $B_2H_6$ gas, an $NH_3$ gas or the like may be used as the reduction gas. Alternatively, two or more of the $H_2$ gas, the $SiH_4$ gas, the $B_2H_6$ gas and the $NH_3$ gas may be supplied. Moreover, in addition to these gases, other reduction gases such as a $PH_3$ gas or an $SiH_2Cl_6$ gas may be used. From the viewpoint of further decreasing impurities in the film to obtain a low resistance value, the $H_2$ gas may be used.

After the first tungsten film 303 is formed in the above way, the stress reduction process as described above is performed to form a second tungsten film 304 as a process film on the first tungsten film 303. Thus, a tungsten film 305 that is lowly stressed is formed. Further, the second tungsten film 304 as the process film is formed in the same manner as the process film 204 described above.

Film thicknesses of the first tungsten film 303 and the second tungsten film 304 may be appropriately determined. Since the first tungsten film 303 that is highly-stressed is formed from the viewpoint of suppressing the etching of the base film 302, the first tungsten film 303 may be formed to have a thin thickness of 10 nm or less. Meanwhile, since the second tungsten film 304 is formed to reduce the stress in the first tungsten film 303, the second tungsten film 304 may be formed to have a thickness that is thin enough to obtain the stress reduction effect. However, since the second tungsten film 304 constitutes a portion of the tungsten film 305, the second tungsten film 304 may be formed to have a thickness that is thick enough to satisfy a desired thickness of the tungsten film 305.

The process of initially forming the first tungsten film 303 and the subsequent stress reduction process may be performed in-situ using a single apparatus without being exposed to the atmosphere. In some embodiments, the initial process of forming the first tungsten film 303 is performed and subsequently, the formed first tungsten film 303 may be exposed to the atmosphere and may be subjected to the stress reduction process in a separated apparatus ex-situ. From the viewpoint of improving the stress reduction effect as will be described below, the in-situ process may be applied.

Figure 8:
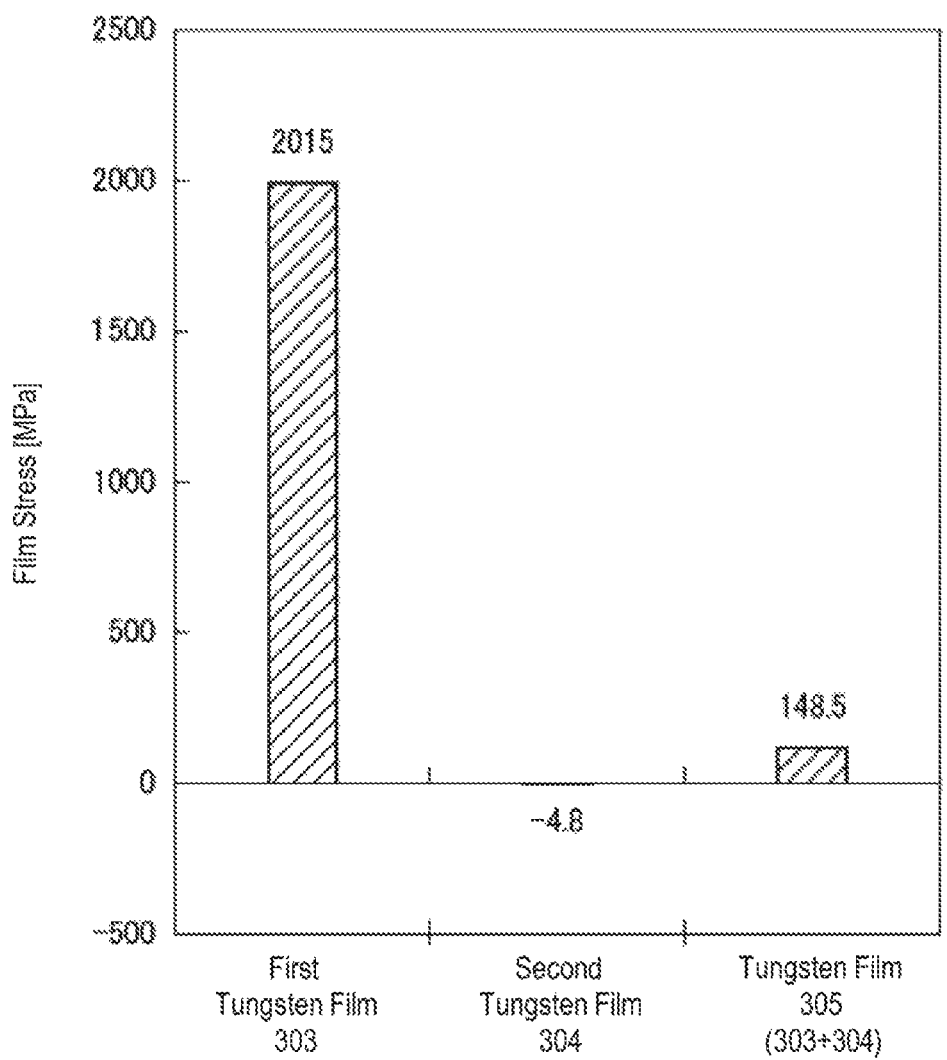
FIG. 8 is a view showing a stress reduction effect when a stress reduction process is actually performed, in the first embodiment of the film forming method.

Actually, the present inventors performed an experiment to measure film stresses applied to the first tungsten film 303, the second tungsten film 304, and the tungsten film 305 including the first tungsten film 303 and the second tungsten film 304, when forming the first tungsten film 303 in a thickness of about 15 nm through the use of the ALD method using the $WCl_6$ gas and the $H_2$ gas under a condition that a film stress is increased, following by performing the stress reduction process in-situ using the same apparatus to form the second tungsten film 304 having a thickness of about 15 nm as the process film. The results of the experiment are shown in FIG. 8. As shown in FIG. 8, the first tungsten film 303 was highly-stressed at a level of 2015 MPa, whereas the second tungsten film 304 formed by the stress reduction process was slightly stressed at a level of −4.8 MPa. Meanwhile, the tungsten film 305 including the first tungsten film 303 and the second tungsten film 304 was stressed at a level of 148.5 Pa. Accordingly, the experiment shows that the film stress was significantly reduced by the stress reduction process.

Figure 9:
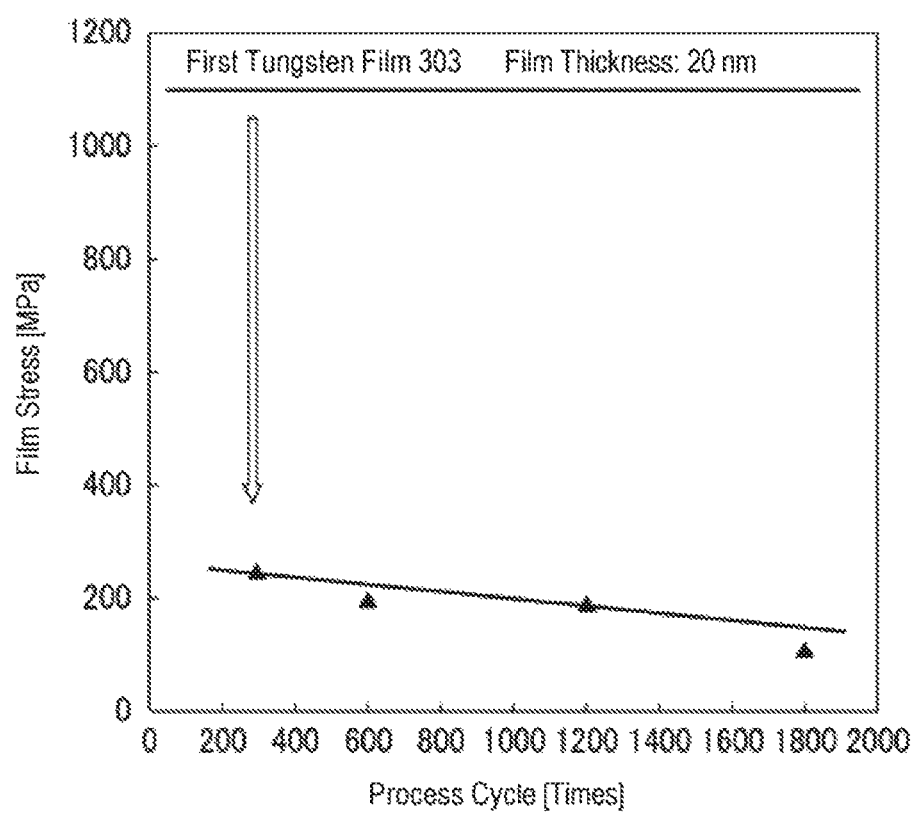
FIG. 9 is a view showing a relationship between the number of cycles in the stress reduction process and a film stress in a tungsten film obtained by the stress reduction process, in the first embodiment of the film forming method.

Further, examination has been performed to confirm a relationship between the number of cycles of the stress reduction process and a film stress in the tungsten film obtained by the stress reduction process. FIG. 9 is a view showing a film stress applied to the tungsten film 305 including the first tungsten film 303 and the second tungsten film 304, when forming the first tungsten film 303 by the ALD method using the $WCl_6$ gas and the $H_2$ gas under a condition that a film stress is increased, following by performing the stress reduction process in-situ using the same apparatus while varying the number of cycles by the ALD method. In FIG. 9, 300 cycles correspond to an example of where a film thickness of the second tungsten film 304 becomes 2.5 nm. As shown in FIG. 9, it is confirmed that, even if the second tungsten film 304 as the process film is thin at the level of 2.5 nm, a sufficient stress reduction effect is obtained.

Figure 10:
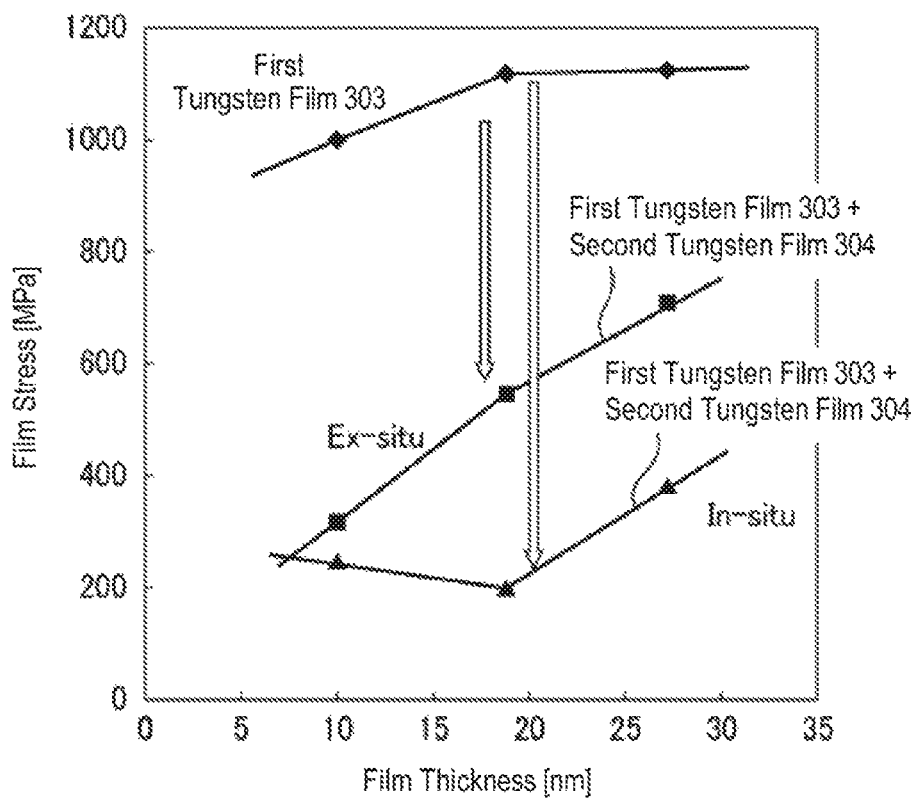
FIG. 10 is a view showing a stress reduction effect when the stress reduction process is performed in-situ and ex-situ by varying a film thickness of a highly-stressed tungsten film, in the first embodiment of the film forming method.

Then, the present inventors confirmed a stress reduction effect when the stress reduction process was performed in-situ and ex-situ while varying the film thickness of the highly-stressed tungsten film 303. The results are show in FIG. 10. As shown in FIG. 10, it can be seen that the thinner the highly-stressed first tungsten film 303, the higher the effect of the stress reduction process is. Moreover, it can be seen that performing the stress reduction process in-situ has a higher stress reduction effect than performing the stress reduction process ex-situ.

The reason why the effect of the ex-situ process is low is that if the wafer is exposed to the atmosphere after the formation of the highly-stressed first tungsten film 303, air may enter to spaces defined between tungsten crystal grains, which impedes the subsequent stress reduction process. For this reason, the stress reduction process is performed in-situ rather than ex-situ. In a case where the stress reduction process is required to be performed ex-situ, a sequence of forming the first tungsten film 303 and discharging air existing between crystal grains may be effective.

<Second Embodiment of Film Forming Method>

Next, a second embodiment of a film forming method will be described.

In this example, a tungsten film is formed using the $WF_6$ gas and the $H_2$ gas and subsequently, the stress reduction process using a $WCl_6$ gas and the $H_2$ gas is performed to form a film.

When the tungsten film is formed by the CVD method using the $WF_6$ gas, fluorine contained in $WF_6$ reduces agate insulation film, which deteriorates an electric property. As such, the use of a $WCl_6$ gas is under consideration instead of the $WF_6$ gas. However, since $WF_6$ is much cheaper than $WCl_6$, $WF_6$ is being used with research of a barrier film.

Figure 11:
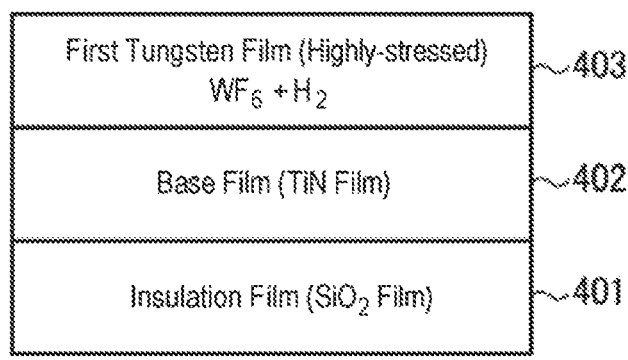
FIG. 11 is a cross-sectional view showing astute where a first tungsten is formed, in a second embodiment of the film forming method.

In this example, the formation of the tungsten film is formed as follows. For example, as shown in FIG. 11, a first tungsten film 403 is formed on a wafer W in which a base film 402 is formed on an insulation film 401 such as an $SiO_2$ film, using the $WF_6$ gas and the gas. Although in FIG. 11, the insulation film 401 and the base film 402 are shown in planar shapes for the sake of simplicity, the insulation film 401 may be formed with fine complex-shaped concave portions in practice, and the base film 402 may be formed along the concave portions.

An example of the base film 402 may include a titanium-based material film such as a TiN film, a TiSiN film, a Ti silicide film, a Ti film, a TiON film, a TiAlN film or the like. In some embodiments, an example of the base film 402 may include a tungsten-based compound film such as a WN film, a $WSi_x$ film, a WSiN film or the like. The formation of the base film 402 allows the tungsten film to be formed with good adhesion.

The tungsten film formed using the $WCl_6$ gas and the $H_2$ gas is known to be highly-stressed. Even in this case, it is considered that stress in such a tungsten film is caused due to distortion between tungsten crystal grains. As such, the first tungsten film 403 is also stressed at a high level of e.g., 1,000 MPa or more.

Figure 12:
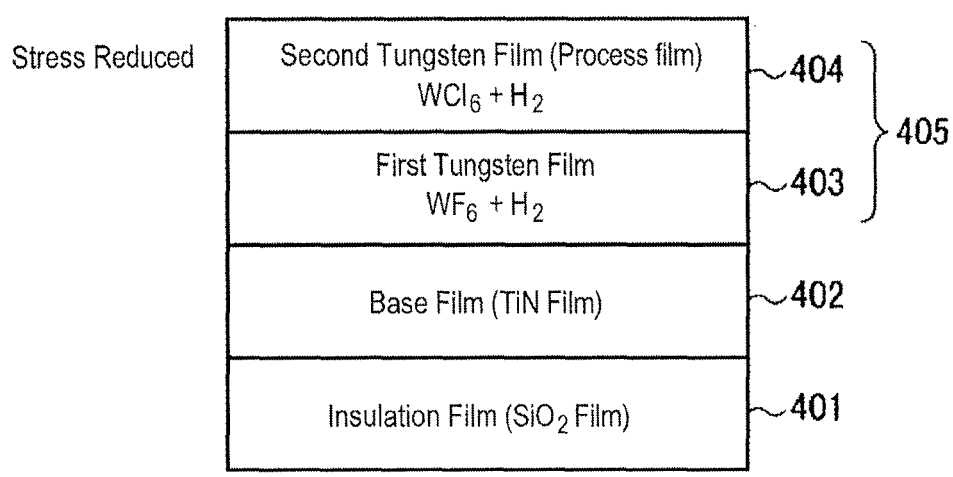
FIG. 12 is a cross-sectional view showing astute where a second tungsten film is formed on the first tungsten film, in the second embodiment of the film forming method.

Thus, as shown in FIG. 12, after the first tungsten film 403 is formed, a second tungsten film 404 as a process film is formed by the aforementioned stress reduction process using the $WCl_6$ gas and the $H_2$ gas. As a result, a tungsten film 405 that is lowly stressed is formed. Further, the second tungsten film 404 as the process film is formed in the same manner as the process film 304 described above.

At this time, thicknesses of the first tungsten film 403 and the second tungsten film 404 may be appropriately set. From the viewpoint of cost-saving, the first tungsten film 403 using the $WF_6$ gas may be formed as thick as possible. In this case, the second tungsten film 404 may be formed to have a thickness thin enough to obtain the stress reduction effect.

Further, the reduction gas is not limited to the $H_2$ gas but may be other reduction gases which contain hydrogen. Instead of the $H_2$ gas, an $SiH_4$ gas, a $B_2H_6$ gas, an $NH_3$ gas or the like may be used as the reduction gas. Alternatively, two or more of the $H_2$ gas, the $SiH_4$ gas, the $B_2H_6$ gas and the $NH_3$ gas may be supplied. Moreover, in addition to these gases, other reduction gases such as a $PH_3$ gas or an $SiH_2Cl_6$ gas may be used. From the viewpoint of further decreasing impurities in the film to obtain a low resistance value, the $H_2$ gas may be used.

The first tungsten film 403 may be formed by the ALD or CVD method using, e.g., the conventional film forming apparatus.

Specifically, a primary step of supplying the $WF_6$ gas, and the $H_2$ gas, the $SiH_4$ gas, the $B_2H_6$ gas or the like as the reduction gas at low flow rates to form the first tungsten film 403 by the ALD method and a secondary step of supplying the $WF_6$ gas and the $H_2$ gas as the reduction gas at high flow rates to form a main tungsten film, are performed such that a nucleation tungsten film is formed. In some embodiments, the $SiH_4$ gas or the $B_2H_6$ gas having a high reduction capacity may be used as the reduction gas used when forming the nucleation tungsten film. In some embodiments, an example of a film formation temperature may fall within a range of approximately 300 to 500 degrees C.

Figure 13:
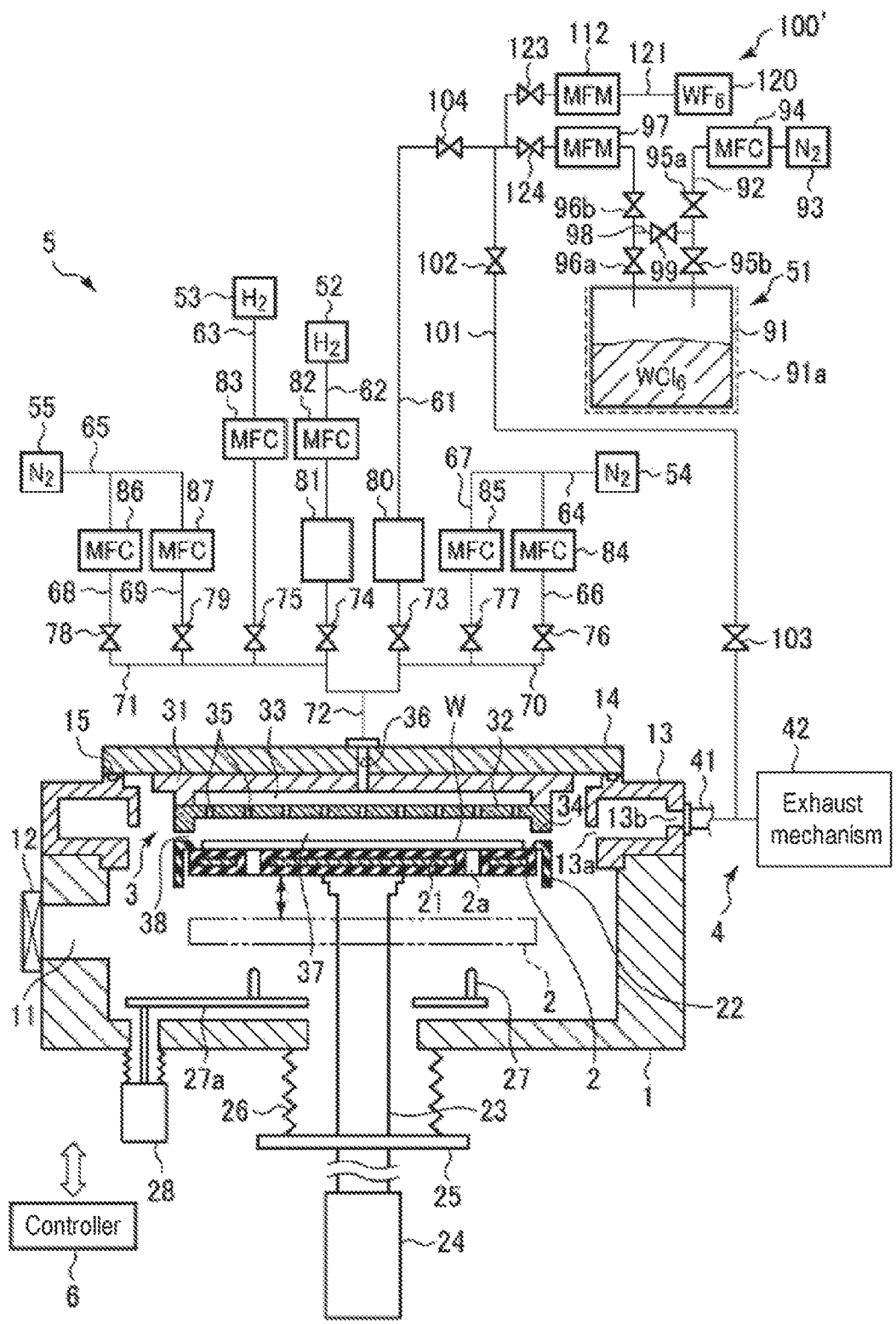
FIG. 13 is a sectional view showing an example of a film forming apparatus which can be used in forming a tungsten film in-situ, in the second embodiment of the film forming method.

Further, in a case where the first tungsten film 403 and the second tungsten film 404 are formed in-situ, since $WF_6$ is in a gaseous state at room temperature, as shown in FIG. 13, a processing apparatus 100' which further includes a $WF_6$ gas supply source 120 in addition to the processing apparatus 100 shown in FIG. 2 may be used to switch the supply of the $WCl_6$ gas and the $WF_6$ gas. The $WF_6$ gas supply source 120 is connected to a $WF_6$ gas supply line 121 which is joined with the $WCl_6$ gas supply line 61 at an upstream side of the connection position between the $WCl_6$ gas supply line 61 and the EVAC pipe 101. A mass flow controller 122 as a flow rate controller and an on-off valve 123 are installed in the $WF_6$ gas supply line 121. Further, an on-off valve 124 is installed in the $WCl_6$ gas supply line 61 at an upstream side of where the $WCl_6$ gas supply line 61 and the $WF_6$ gas supply line 121 are joined.

With the processing apparatus 100', the first tungsten film 403 is formed using the $WF_6$ gas and subsequently, the second tungsten film 404 is formed using the $WCl_6$ gas in-situ, which makes it possible to improve a stress reduction effect.

<Other Applications>

While the present disclosure has described exemplary embodiments, the present disclosure is not limited thereto, but may be modified in a variety of forms. As an example, although in the above embodiments, the tungsten chloride gas and the reduction gas has been described to be used for the stress reduction process of the tungsten film, the present disclosure is not limited thereto. In some embodiments, a chloride gas of another metal film and a reduction gas may be used to reduce stress in the respective metal film. As an example, the present disclosure may be applied to a case where a molybdenum chloride gas and a reduction gas are used to reduce stress in a molybdenum film or a case where a tantalum chloride gas and a reduction gas are used to reduce stress in a tantalum film.

Further, although in the above embodiments, the semiconductor wafer has been described to be used as a target substrate, the semiconductor wafer may be a silicon substrate, or a compound semiconductor such as GaAs, SiC and GaN or the like. The present disclosure is not limited to the semiconductor wafer but may be also applied to a glass substrate used in a flat panel display (FPD) such as a liquid crystal display, a ceramic substrate or the like.

According to the present disclosure in some embodiments, a highly-stressed metal film is processed by a metal chloride gas containing a respective metal and a reduction gas for reducing the metal chloride gas which are supplied thereonto, so that a process film is formed on the metal film. Thus, it is possible to reduce stress in the highly-stressed metal film.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of reducing stress in a metal film that is highly stressed, the method comprising:
   processing the metal film to reduce stress in the metal film by supplying a metal chloride gas containing a metal of the metal film and a reduction gas for reducing the metal chloride gas onto the metal film so as to perform:
      etching the metal film by HCl generated from a reaction between the metal chloride gas and the reduction gas to generate gaps between crystal grains of the metal film; and
      forming a process film in the gaps and on a surface of the metal film.

2. The method of claim 1, wherein the processing the metal film is performed by loading a target substrate having the metal film formed thereon into a chamber maintained under a depressurized atmosphere; and sequentially or simultaneously supplying the metal chloride gas and the reduction gas into the chamber such that the process film is formed on the metal film.

3. The method of claim 1, wherein the stress in the metal film is controlled by adjusting a process condition and a thickness of the process film in the processing the metal film.

4. The method of claim 1, wherein the metal film is a tungsten film, and the metal chloride gas used in the processing the metal film is a tungsten chloride gas.

5. The method of claim 4, wherein the processing the metal film is performed under a condition that a partial pressure of the tungsten chloride gas ranges from 0.5 to 10 Torr.

6. The method of claim 4, wherein the tungsten film as the metal film is formed by loading the target substrate into the chamber maintained under the depressurized atmosphere and sequentially supplying the tungsten chloride gas and the reduction gas into the chamber,
wherein a flow rate of the tungsten chloride gas when forming the metal film is lower than that of the tungsten chloride gas in the processing the metal film.

7. The method of claim 6, wherein a partial pressure of the tungsten chloride gas when forming the tungsten film as the metal film is 1 Torr or less.

8. The method of claim 4, wherein the tungsten film as the metal film is formed by loading the target substrate into the chamber maintained under the depressurized atmosphere and supplying a $WF_6$ gas and the reduction gas into the chamber.

9. The method of claim 4, wherein the tungsten chloride is one of $WCl_6$, $WCl_5$, and $WCl_4$.

10. The method of claim 1, wherein the reduction gas is at least one of an $H_2$ gas, an $SiH_4$ gas, a $B_2H_6$ gas and an $NH_3$ gas.

11. The method of claim 1, wherein the stress in the metal film before processing the metal film is 1,000 MPa or more.

12. A method of forming a metal film, comprising:
forming a metal film on a target substrate; and
processing the metal film to reduce stress in the metal film by supplying a metal chloride gas containing a metal of the metal film and a reduction gas for reducing the metal chloride gas so as to perform:
etching the metal film by HCl generated from a reaction between the metal chloride gas and the reduction gas to generate gaps between crystal grains of the metal film; and
forming a process film in the gaps and on a surface of the metal film.

13. The method of claim 12, wherein the process film is formed by loading the target substrate with the metal film formed thereon into a chamber maintained under a depressurized atmosphere and sequentially or simultaneously supplying the metal chloride gas and the reduction gas into the chamber.

14. The method of claim 12, wherein the stress in the metal film is controlled by adjusting a process condition and a thickness of the process film in the forming a process film.

15. The method of claim 12, wherein the stress in the metal film before processing the metal film is 1,000 MPa or more.

16. A method of forming a metal film, comprising:
forming a first tungsten film as the metal film by sequentially supplying a tungsten chloride gas and a reduction gas for reducing the tungsten chloride gas onto a target substrate; and
forming a second tungsten film as a process film on the first tungsten film by performing a process on the target substrate to reduce stress in the first tungsten film, the process including sequentially or simultaneously supplying the tungsten chloride gas and the reduction gas for reducing the tungsten chloride gas onto the target substrate with the first tungsten film formed thereon so as to perform:
etching the metal film by HCl generated from a reaction between the metal chloride gas and the reduction gas to generate gaps between crystal grains of the first tungsten film; and
forming the second tungsten film in the gaps and on a surface of the first tungsten film,
wherein a flow rate of the tungsten chloride gas in the forming a first tungsten film is lower than that of the tungsten chloride gas in the forming the second tungsten film.

17. The method of claim 16, wherein a partial pressure of the tungsten chloride gas in the forming a first tungsten film is 1 Torr or less, and a partial pressure of the tungsten chloride gas in the forming a second tungsten film ranges from 0.5 to 10 Torr.

18. The method of claim 16, wherein, in the forming a first tungsten film and the forming a second tungsten film, a temperature of the target substrate is 300 degrees C. or more and a pressure is 5 Torr or more.

19. The method of claim 16, wherein the tungsten chloride is one of $WCl_6$, $WCl_5$, and $WCl_4$.

20. The method of claim 16, wherein the reduction gas is at least one of an $H_2$ gas, an $SiH_4$ gas, a $B_2H_6$ gas and an $NH_3$ gas.

21. The method of claim 16, wherein the stress in the first tungsten film is 1,000 MPa or more.

* * * * *